(12) United States Patent
Fröhlich et al.

(10) Patent No.: US 9,300,259 B2
(45) Date of Patent: Mar. 29, 2016

(54) SENSOR AMPLIFIER ARRANGEMENT AND METHOD FOR AMPLIFICATION OF A SENSOR SIGNAL

(75) Inventors: Thomas Fröhlich, Wattail (CH); Matthias Steiner, Seiersberg (AT)

(73) Assignee: ams AG (AT)

( * ) Notice: Subject to any disclaimer, the term of this patent is extended or adjusted under 35 U.S.C. 154(b) by 1016 days.

(21) Appl. No.: 13/438,975

(22) Filed: Apr. 4, 2012

(65) Prior Publication Data
US 2013/0266156 A1    Oct. 10, 2013

(51) Int. Cl.
| | |
|---|---|
| *H03L 5/00* | (2006.01) |
| *H03F 1/02* | (2006.01) |
| *H03F 3/187* | (2006.01) |
| *H03F 1/34* | (2006.01) |

(52) U.S. Cl.
CPC .............. *H03F 3/187* (2013.01); *H03F 1/34* (2013.01); *H03F 2200/213* (2013.01); *H04R 2430/01* (2013.01)

(58) Field of Classification Search
CPC ..... H03F 3/187; H03F 1/34; H03F 2200/213; H04R 2430/01
USPC ........................................ 327/306, 307; 330/9
See application file for complete search history.

(56) References Cited

U.S. PATENT DOCUMENTS

| | | | |
|---|---|---|---|
| 4,535,233 A | 8/1985 | Abraham | |
| 5,097,224 A * | 3/1992 | Madaffari et al. | 330/277 |
| 6,023,194 A * | 2/2000 | Madaffari | 330/277 |
| 6,271,780 B1 * | 8/2001 | Gong et al. | 341/139 |
| 6,566,960 B1 * | 5/2003 | Carver | 330/297 |
| 6,873,206 B1 | 3/2005 | Hildebrant et al. | |
| 7,787,634 B1 * | 8/2010 | Dahl | 381/61 |
| 8,063,700 B2 | 11/2011 | Fröhlich et al. | |
| 8,587,974 B2 * | 11/2013 | Jonsson et al. | 363/98 |
| 8,625,809 B2 * | 1/2014 | Josefsson et al. | 381/8 |
| 8,855,335 B2 * | 10/2014 | Henriksen | 381/120 |
| 2007/0222510 A1 | 9/2007 | Hong et al. | |
| 2011/0227652 A1 | 9/2011 | Froehlich et al. | |
| 2012/0155675 A1 | 6/2012 | Forehlich et al. | |

FOREIGN PATENT DOCUMENTS

| | | |
|---|---|---|
| DE | 10 2010 012 269 A1 | 9/2011 |
| WO | 02/086795 A1 | 10/2002 |
| WO | 2008/110444 A2 | 9/2008 |

OTHER PUBLICATIONS

The European Search Report dated Mar. 4, 2014 for corresponding European Application No. 13161671.6.
C. Hoyle, et al., "Bootstrapping Techniques to Improve the Bandwidth of Transimpedance Amplifiers," XP006502909, Oct. 28, 1998, pp. 7/1-7/6.
"Vox Busker AF43," http://www.6v6power.ru/inf/Amplifier/Vox/Vox%20Busker%20%20AF43%20%281984%29.jpg, XP055102303, Jan. 1, 1984 (one page).

(Continued)

*Primary Examiner* — Kenneth B Wells
(74) *Attorney, Agent, or Firm* — DLA Piper LLP (US)

(57) ABSTRACT

A sensor amplifier arrangement includes an amplifier having a signal input to receive a sensor signal and a signal output to provide an amplified sensor signal, and a feedback path that couples the signal output to the signal input and provides a feedback current that is an attenuated signal of the amplified sensor signal and is inverted with respect to the sensor signal.

17 Claims, 11 Drawing Sheets

(56) References Cited

OTHER PUBLICATIONS

"Negative Feedback in Amplifiers and Ssytems," httpj://www.electornics-tutorials.ws/blog/negative-feedback.htm, XP055101865, Nov. 30, 2010 (six pages).

Cheng, A., "Design of a Readout Scheme for a MEMS Microphone," TU Delft, Electrical Engineering, Mathematics and Computer Science, Dec. 23, 2009, cover and pp. 1-75.

Citakovic, J. et al., "A Compact CMOS MEMS Microphone with 66dB SNR," 2009 IEEE International Solid-State Circuits Conference, 978-1-4244-3457-2/09, pp. 350-351 and 1 page continuation.

Nielsen, J.H. et al., "Toward More-Compact Digital Microphones," Analog Dialogue, printout from http.//www.analog.com/analogdialogue, Sep. 2007, pp. 41-09 (printout pp. 1-3).

van den Boom, J., "A 50μW Biasing Feedback Loop with 6ms Settling Time for a MEMS Microphone with Digital Output," 2012 IEEE International Solid-State Circuits Conference, pp. 200-201, 978-4673-0377-4/12.

\* cited by examiner

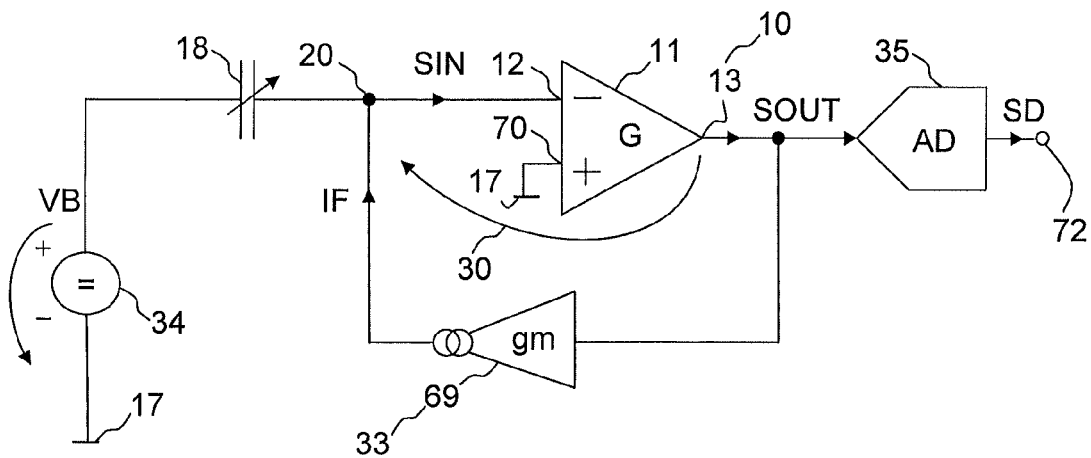

SENSOR AMPLIFIER ARRANGEMENT AND METHOD FOR AMPLIFICATION OF A SENSOR SIGNAL

TECHNICAL FIELD

This disclosure relates to the field of electronics and primarily to a sensor amplifier arrangement and to a method for amplification of a sensor signal.

BACKGROUND

Sensors are often realized as capacitive sensors, whereas the signal which has to be measured changes the capacitance of the sensor. A sensor amplifier arrangement commonly receives the sensor signal that is provided by the sensor and amplifies the sensor signal for providing an amplified sensor signal.

SUMMARY

Our sensor amplifier arrangement comprises an amplifier and a feedback path. The amplifier comprises a signal input to receive a sensor signal and a signal output to provide an amplified sensor signal. The feedback path couples the signal output to the signal input. The feedback path provides a feedback current that is an attenuated signal of the amplified sensor signal and is inverted with respect to the sensor signal.

Our sensor amplifier arrangement may also comprise an amplifier and a feedback path. The amplifier comprises a signal input to receive a sensor signal and a signal output to provide an amplified sensor signal. The feedback path couples the signal output to the signal input and comprises an anti-parallel circuit of diodes, an offset signal source and an adder. The adder comprises a first and a second input as well as an output. The first input of the adder is coupled to the signal output. The second input of the adder is coupled to the offset signal source. The output of the adder is coupled to the signal input via the anti-parallel circuit of diodes.

Our sensor amplifier arrangement may further comprise an amplifier and a feedback path. The amplifier comprises a signal input to receive a sensor signal and a signal output to provide an amplified sensor signal. The feedback path couples the signal output to the signal input and comprises an anti-parallel circuit of diodes and a voltage divider. The voltage divider couples the signal output to a reference potential terminal. A voltage divider tap of the voltage divider is coupled to the signal input via the anti-parallel circuit of diodes.

Our method for amplification of a sensor signal comprises receiving a sensor signal at a signal input of an amplifier. The sensor signal is amplified and an amplified sensor signal is provided at a signal output of the amplifier. A feedback current is fed back by a feedback path. The feedback path couples the signal output to the signal input. The feedback current is an attenuated signal of the amplified sensor signal and is inverted with respect to the sensor signal.

BRIEF DESCRIPTION OF THE DRAWINGS

Our sensor amplifier arrangement and methods will be described in detail below using a plurality of exemplary structures with reference to the figures.

FIGS. 4A, 4B, 5A to 5C show examples of a sensor amplifier arrangement.

DETAILED DESCRIPTION

Elements with identical function or effect bear identical reference numbers. Where circuit parts and elements match in term of components or in terms of their function, the description thereof is not repeated for each of the subsequent figures.

Figure 1A:
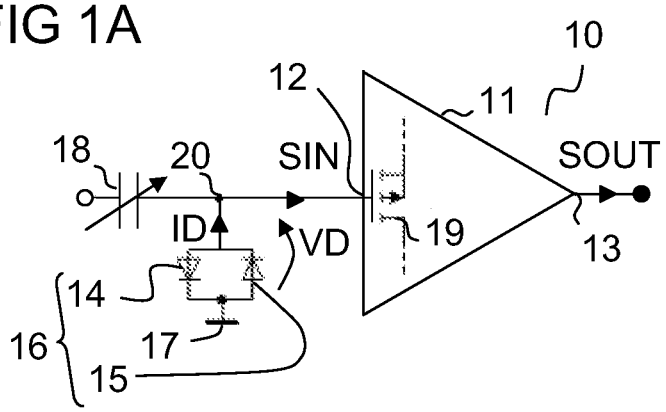
FIGS. 1A to 1C show an example of a sensor amplifier arrangement and signal-time diagrams of signals of the sensor amplifier arrangement.

FIG. 1A shows an example of a sensor amplifier arrangement 10. The sensor amplifier arrangement 10 comprises an amplifier 11 with a signal input 12 and a signal output 13. Moreover, the sensor amplifier arrangement 10 comprises a first and a second diode 14, 15. The first and the second diode 14, 15 are connected in a parallel circuit. The diodes 14, 15 are bipolar diodes. An anode of the first diode 14 is connected to a cathode of the second diode, whereas a cathode of the first diode 14 is connected to an anode of the second diode 15. The first and the second diode 14, 15 form an anti-parallel circuit of diodes 16. The anti-parallel circuit of diodes 16 can be realized as a pair of anti-parallel diodes. The anti-parallel circuit of diodes 16 couples the signal input 12 to a reference potential terminal 17. The amplifier 11 comprises an input transistor 19. A control terminal of the input transistor 19 connects to the signal input 12. The input transistor 19 is realized as a field-effect transistor. The input transistor 19 is implemented as a metal-oxide-semiconductor field-effect transistor. The input transistor 19 is designed a p-channel field-effect transistor. The amplifier 11 is implemented as a pre-amplifier.

The sensor amplifier arrangement 10 comprises a sensor 18. The sensor 18 is realized as a capacitive sensor. The sensor 18 is implemented as a microphone. The microphone is realized as a micro-electro-mechanical system. The microphone is coupled to the signal input 12. An electrode of the sensor 18 is coupled to the signal input 12 via a sensor output 20.

A sensor signal SIN can be tapped at the electrode of the sensor 18. The sensor signal SIN is provided to the signal input 12. The amplifier 11 amplifies the sensor signal SIN and provides an amplified sensor signal SOUT at the signal output 13. The amplified sensor signal SOUT is an amplified signal of the sensor signal SIN. The sensor signal SIN and the amplified sensor signal SOUT are realized in the form of voltages. A ground potential is provided at the reference potential terminal 17. A diode voltage VD can be tapped across the first diode 14 and, therefore, also across the second diode 15. According to FIG. 1A, the diode voltage VD and the sensor signal SIN have the same absolute value. A current ID flows through the anti-parallel circuit of diodes 16. If the diode voltage VD is larger than a forward voltage VF of one of the diodes 14, 15, the diode current ID obtains a value which is different from zero. Therefore, the diode current ID flows through the anti-parallel circuit of the diodes 16 until the diode voltage VD follows the following equation:

$$-VF < VD < VF.$$

The sensor 18 implemented as a MEMS microphone typically needs input impedances exceeding 10 TΩ. These input impedances are usually achieved by using the anti-parallel circuit of diodes 16 to bias the signal input 12.

Alternatively, but not shown, the anti-parallel circuit of diodes 16 couples the signal input 12 to an offset voltage source which provides an offset voltage VOF. The first and the second diode 14, 15 typically clamp the voltage value of the sensor signal SIN according to the following equation:

$$VOF-VF<SIN<VOF+VF.$$

Outside of this voltage region, impedances of the first and the second diode 14, 15 get low enough to attenuate the sensor signal SIN for typical audio frequencies.

Figure 1B:
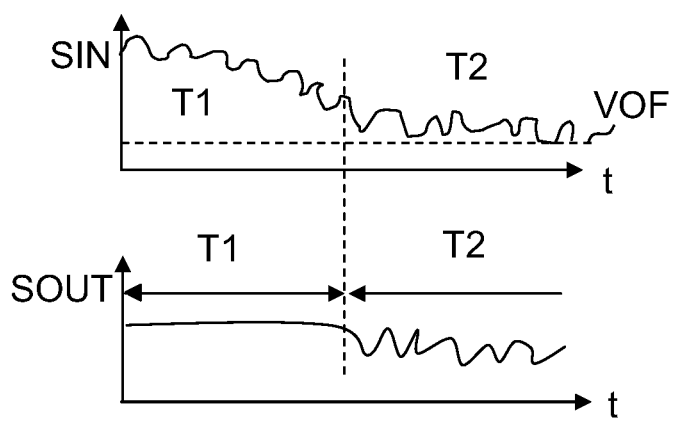

FIG. 1B shows an exemplary signal-time diagram of the sensor signal SIN and the amplified sensor signal SOUT. During a first period of time T1, the sensor signal SIN obtains high values. Thus, the amplifier 11 is not able to amplify these high values of the sensor signal SIN and provides the amplified sensor signal SOUT with a high and approximately constant value. The amplified sensor signal SOUT can obtain, for example, a value of a supply voltage of the amplifier 11 during the first period of time T1. Signal muting as shown in the first period of time T1 can, for example, occur, if a charge is injected at the signal input 12 due to a supply glitch, an electro-magnetic compatibility event or mechanical stress, typically at the sensor 18. As a result, the amplifier 11 will stop working and the sensor amplifier arrangement 10 can mute for several seconds.

In FIG. 1B a situation is illustrated where the voltage value of the sensor signal SIN rises above the limit which the amplifier 11 can handle. This may be the case for small supply values. The amplifier 11 does not provide an AC amplified sensor signal SOUT until the voltage value of the sensor signal SIN returns to a lower value. The first period of time T1 can last seconds to minutes.

During a second period of time T2, the sensor signal SIN obtains values which can be amplified by the amplifier 11. Thus, the amplified sensor signal SOUT is generated as an amplified signal of the sensor signal SIN.

Figure 1C:
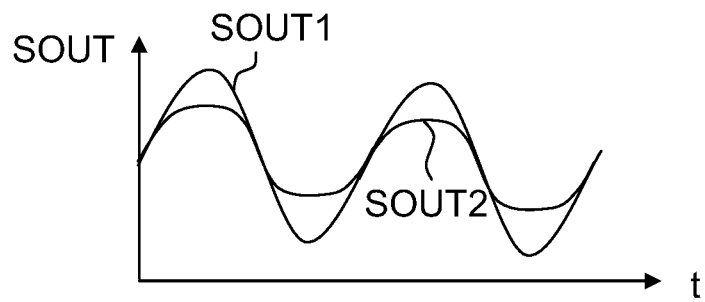

FIG. 1C shows another exemplary signal-time diagram of the amplified sensor signal SOUT. In case the sensor signal SIN obtains a sine wave form, the amplified sensor signal SOUT ideally also shows values SOUT1 in a sine wave form. Since the anti-parallel circuit of diodes 16 causes a diode clamping at the signal input 12, distorted values SOUT2 may be generated by the amplifier 11 in case of a high amplitude of the sensor signal SIN. A signal clamping for loud sounds results in the values SOUT2 of the amplified sensor signal.

The first and the second diode 14, 15 limit the peak amplitude of the sensor signal SIN and cause large distortion for loud sounds. The clamping limits the maximum signal amplitude that the sensor amplifier arrangement 10 can handle. The input DC voltage level of the sensor signal SIN is controlled by the anti-parallel circuit of diodes 16 that connects to a constant biasing offset voltage source. The constant offset voltage source ensures that the sensor signal SIN is slowly drawn back to the offset voltage VOF. Thus, the sensor signal SIN is kept close to the offset voltage VOF, whereas a high input impedance at voltage values of the sensor signal SIN close to the offset voltage VOF are still maintained. The biasing characteristic is fixed by the behavior of the first and the second diode 14, 15. Consequently, the range for the allowed AC values of the sensor signal SIN can neither be extended nor reduced. Therefore, AC values of the sensor signal which are larger than about +/−300 mV are inherently reported with a significant distortion. In case the amplifier 11 receives only sensor signals SIN out of a smaller input voltage range, the amplifier 11 cannot be protected from an excessive input voltage resulting in AC signal muting shown in FIG. 1B.

The diode characteristic and the input's small impedance, that means the impedance for small values of the sensor signal SIN, can be calculated according to the equations:

$$ID = IS \cdot (e^{VD/VT} - 1);$$

$$ZIN = \frac{VT}{ID} = \frac{VT}{IS \cdot (e^{(SIN-VOF)/VT} - 1)};$$

wherein ID is the diode current of the second diode 15; IS is the reverse bias saturation current; VD is the diode voltage; VT is the thermal voltage; ZIN is the input impedance of the amplifier 11, wherein the input impedance ZIN is a function of SIN-VOF; VOF is the offset voltage.

Figure 2A:
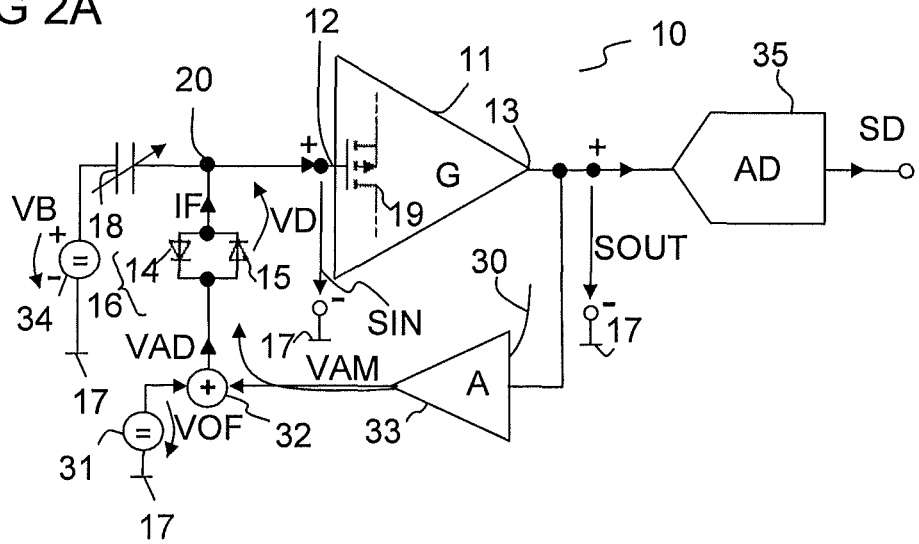
FIGS. 2A to 2C show examples of a sensor amplifier arrangement and an impedance characteristic.

FIG. 2A shows an exemplary sensor amplifier arrangement 10. The sensor amplifier arrangement comprises the amplifier 11 and a feedback path 30. The feedback path 30 couples the signal output 13 to the signal input 12. The feedback path 30 comprises the anti-parallel circuit of diodes 16, an offset signal source 31 and an adder 32. A first input of the adder 32 is coupled to the signal output 13. A second input of the adder 32 is connected to the offset signal source 31. An output of the adder 32 is coupled to the signal input 12 via the anti-parallel circuit of diodes 16. The feedback path 30 comprises a feedback amplifier 33. An input of the feedback amplifier 33 is connected to the signal output 13, whereas an output of the feedback amplifier 32 is connected to the first input of the adder 32. A bootstrapping gain BG is defined by the product of the amplification factor A of the feedback amplifier 33 and the gain G of the amplifier 11. The amplification factor A can have a positive or a negative value. The gain G can have a positive or a negative value. The bootstrapping gain BG obtains values according to the following equation:

$$-\infty<BG=A\cdot G<+1.$$

The feedback amplifier 33 is implemented as an operational amplifier. The amplifier 11 comprises a source follower circuit which is connected to the signal input 12. The source follower circuit comprises the input transistor 19. The amplifier 11 is implemented as a complementary metal-oxide-semiconductor amplifier, abbreviated CMOS amplifier. Alternatively, the amplifier 11 is realized as a combined bipolar CMOS amplifier. The feedback amplifier 33 comprises one stage. Alternatively, the feedback amplifier 33 comprises more than one stage. Moreover, the sensor amplifier arrangement 10 comprises an analog-to-digital converter 35 coupled at its input side to the signal output 13. The feedback path 30 couples a node between the amplifier 11 and the analog-to-digital converter 35 to the signal input 12. The sensor amplifier arrangement 10 comprises a biasing voltage source 34 connected to the sensor 18. Thus, the electrode of the sensor 18 connects to the signal input 12 and a further electrode of the sensor 18 connects to the biasing voltage source 34. The biasing voltage source 34 is designed for high voltage biasing of the sensor 18.

The feedback path 30 is realized as an analog circuit. The feedback path 30 is free from a digital circuit such as an inverter or an analog-to-digital converter. The feedback path 30 is implemented as a pure analog circuitry. This results in a small area requirement on a semiconductor body and small power consumption.

The feedback path 30 generates a feedback current IF that flows from the adder 32 to the sensor output 20 between the sensor 18 and the signal input 12 via the anti-parallel circuit of diodes 16. The biasing voltage source 34 provides a biasing voltage VB applied to the further electrode of the sensor 18. The movement of the electrodes of the capacitive sensor 18 to each other and the feedback current IF provided by the feedback path 30 generate the sensor signal SIN. The amplified sensor signal SOUT is a non-inverted signal with respect to the sensor signal SIN. The analog-to-digital converter 35 generates a digital signal SD that is a digitized amplified sensor signal SOUT. The offset signal source 31 is implemented as a voltage source. The offset signal source 31 supplies an offset voltage VOF to the adder 32. The feedback amplifier 33 applies an amplifier voltage VAM to the adder 32. The adder 32 is designed as voltage adder. The adder 32 is realized as a summing circuit which sums up voltages at the first and the second input of the adder 32. Thus, the adder sums up the offset voltage VOF and the amplifier voltage VAM and generates an adder voltage VAD. Thus, the amplifier voltage VAM, the adder voltage VAD and the diode voltage VD are calculated according to the following equations:

$$VAM = A \cdot SOUT; VAD = VOF + VAM; VD = VAD - SIN.$$

The sensor signal SIN and the amplified sensor signal SOUT are voltages measured with reference to the reference potential terminal 17 and depicted as arrows. The arrows are directed from a positive potential indicated by + to a negative potential indicated by −. If the sensor signal SIN and the amplified sensor signal SOUT are positive voltages, the arrowhead is at the negative potential. In case the feedback current IF is positive, than a positive charge flows in the direction of the arrow and electrons flow in the direction opposite to the arrow. The conventional current notation is used in the drawings.

The feedback current IF depends on the amplified sensor signal SOUT in a non-linear fashion. This results from the anti-parallel circuit of diodes 16. The feedback current IF flows such that a change of the sensor signal SIN is reduced. The feedback current IF has the effect that the DC value of the sensor signal SIN becomes equal to the offset voltage VOF. The feedback path 30 acts as a bootstrapping loop between the signal output 13 and the signal input 12. The feedback path 30 is implemented as a biasing circuit for the signal input 12. The clipping level of the anti-parallel circuit of diodes 16 is adjusted by a constant specified value by the offset voltage source 31. Furthermore, the clipping level is also adaptively changed during operation by the feedback amplifier 33 and the value of the amplified sensor signal SOUT. The sensor amplifier arrangement 10 exhibits a very low noise level and a high input impedance for small values of the sensor signal SIN. The sensor amplifier arrangement 10 can be comprised by a digital MEMS microphone interface ASIC. ASIC is the abbreviation for application specific integrated circuit.

Alternatively, the first input of the adder 32 is implemented as a subtracting input. Thus, the adder voltage VAD is calculated according to VAD=VOF−VAM. The adder 32 is realized as a subtracting circuit. The feedback current IF is an inverted signal with respect to the amplified sensor signal SOUT.

Alternatively, the analog-to-digital converter 35 is omitted.

Figure 2B:
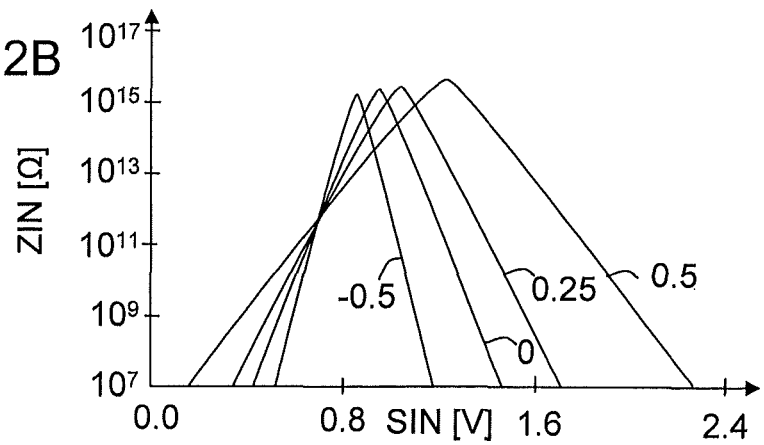

FIG. 2B shows an exemplary input impedance characteristic of the signal input 12 of the amplifier 11. The input impedance ZIN is shown versus the voltage value of the sensor signal SIN for different bootstrapping gains BG. The bootstrapping gain BG is defined by the product of the amplification factor A of the feedback amplifier 33 and the gain G of the amplifier 11. The bootstrapping gain BG can obtain positive and negative values. FIG. 2B shows the simulation results.

The biasing circuit provided by the feedback path 30 can fine-tune the current/voltage characteristic by stretching or squeezing the behavior of the anti-parallel circuit of diodes 16. The fine-tuning can be performed by adjusting the bootstrap gain factor A of the feedback amplifier 33 of the feedback path 30. The characteristic of the biasing circuit is selected to exactly match the signal amplitude requirements, supply voltage constraints, allowed input voltage range of the amplifier 11 and the like. The feedback path 30 smoothly limit's the sensor signal SIN. Thus, the distortion is very low. The first and the second diode 14, 15 are bootstrapped with an amplified or attenuated output signal SOUT of the amplifier 11.

As shown in FIG. 2B, the input impedance ZIN at the signal input 12 of the amplifier 11 can be calculated according to the following equation:

$$ZIN = \frac{VT}{ID} = \frac{VT}{IS \cdot (e^{((1-BG) \cdot SIN - VOF)/VT} - 1)};$$

$$BG = A \cdot G;$$

wherein G is the gain of the amplifier 11; A is the attenuation of the bootstrapping loop provided by the feedback path 30; and VOF is the offset voltage provided by the offset voltage source 31. The attenuation A is approximately equal to the amplification factor of the feedback amplifier 33 in the example shown in FIG. 2A. The attenuation A has a value smaller than 1.

The offset voltage VOFF defines the DC operating point of the sensor signal SIN. The bootstrapping gain BG is chosen such that it does not reach or exceed the unity gain. Theoretically, the bootstrapping gain BG can become any negative number. This would reduce the input impedance for a given voltage of the sensor signal SIN and result in earlier limiting of the sensor signal SIN.

Figure 2C:
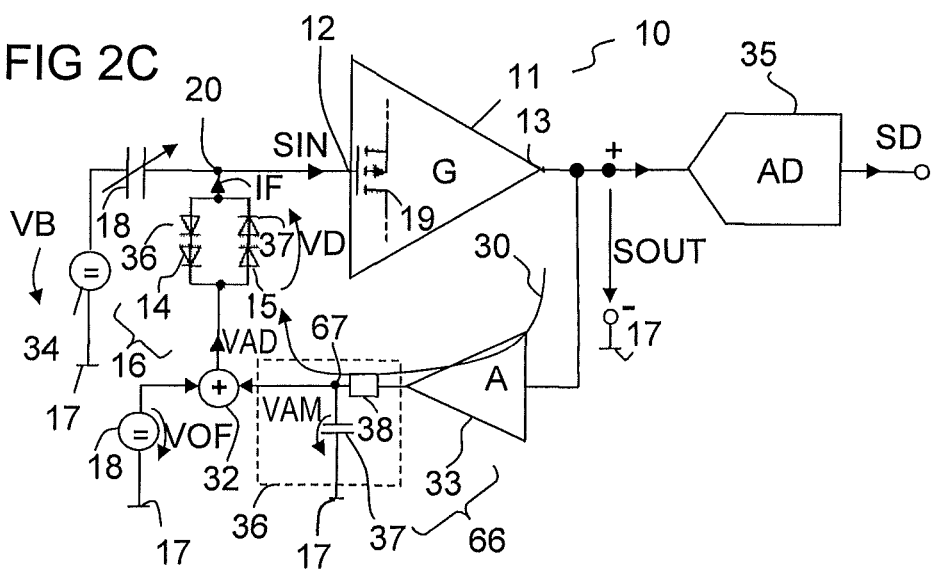

FIG. 2C shows an example of the sensor amplifier arrangement 10 that is a further development of the example shown in FIG. 2A. The feedback path 30 comprises a filter 36. The filter 36 is arranged between the output of the feedback amplifier 33 and the first input of the adder 32. The filter 36 is realized as a low-pass filter. The filter 36 comprises a filter capacitor 37 and a filter resistor 38. The filter 36 implements frequency selectivity in the feedback path 30. The filter 36 and the feedback amplifier 33 form an integrator 66. The feedback path 30 obtains a low-pass characteristic. Further on, the anti-parallel circuit of diodes 16 comprises a third and a fourth diode 36, 37. The third diode 36 is arranged in series to the first diode 14 and the fourth diode 37 is arranged in series to the second diode 15. Thus, diodes 14, 15, 36, 37 are stacked in series, which increases the voltage range of the sensor signal SIN. The voltage range is an integer multiple of the forward voltage VF.

Alternatively, but not shown, the filter 36 is realized as band-stop filter.

Alternatively, but not shown, the filter 36 is arranged between the output of the adder 32 and the anti-parallel circuit of diodes 16.

Alternatively, but not shown, at least a further series circuit which comprises a further feedback amplifier and a further filter couples the signal output 13 to the adder 32. Thus, several loops with different frequency behaviors are added together.

Alternatively, the feedback amplifier 33 is implemented as an operational transconductance amplifier, abbreviated OTA. The OTA generates a current which is supplied to the filter 36.

Thus, at the output of the filter 36, the amplifier voltage VAM can be tapped which is provided to the first input of the adder 32.

Figure 3A:
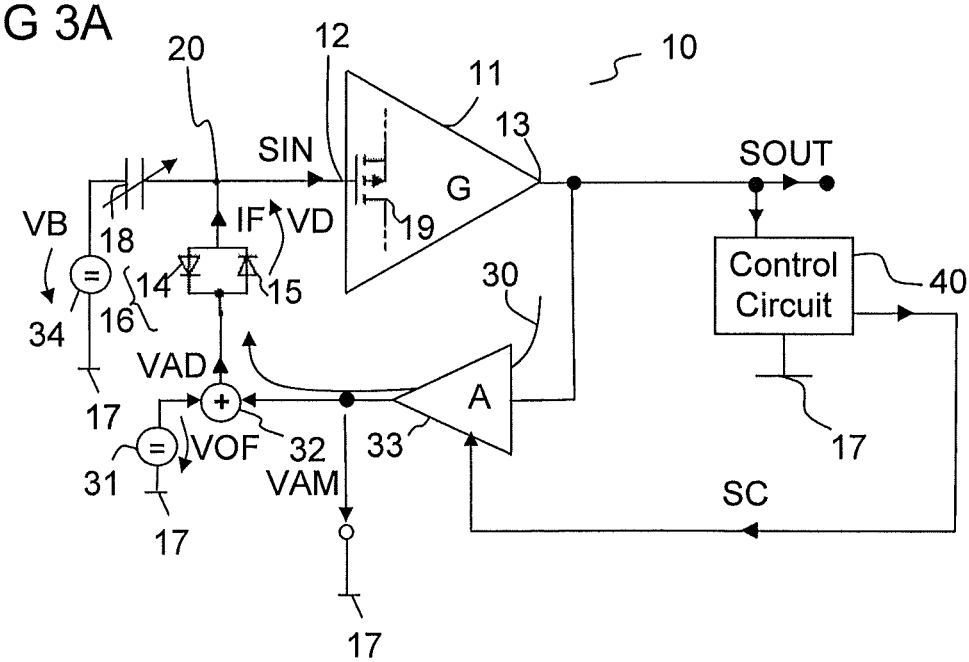
FIGS. 3A to 3E show examples of a sensor amplifier arrangement and of a resistor.

FIG. 3A shows an example of the sensor amplifier arrangement 10 with a further development of the examples shown in FIGS. 1A, 2A and 2C. The sensor amplifier arrangement 10 comprises a control circuit 40 connected on its output side to a control input of the feedback amplifier 33. The control circuit 40 connects to the signal output 13 and to the reference potential terminal 17. The control circuit 40 generates a control signal SC which is provided to the control input of the feedback amplifier 33.

The control signal SC depends on the amplified sensor signal SOUT. The control circuit 40 can realize a gain adjustment of the feedback amplifier 33 that is dependent on the amplified output signal SOUT. The feedback amplifier 33 is implemented as a variable gain amplifier. The gain of the feedback amplifier 33 is controlled by the control signal SC. Thus, the sensor amplifier arrangement 10 realizes an adaptive input dynamic range control which depends on the amplified sensor signal SOUT. The feedback path 30 provides an adaptive loop which selects the gain A in the feedback path 30 depending on the amplified sensor signal SOUT. This is equivalent to a signal-dependent gain or a non-linear gain of the feedback path 30. The sensor amplifier arrangement can realize a well-defined input signal dynamic range limiting with soft clipping. The clipping behavior is smoother than with a diode clipping.

The gain of the feedback amplifier 33 may be different for positive or negative half ways of the amplified sensor signal SOUT. Thus, non-symmetrical diode characteristics can be compensated and second-order harmonics can be removed.

Figure 3B:
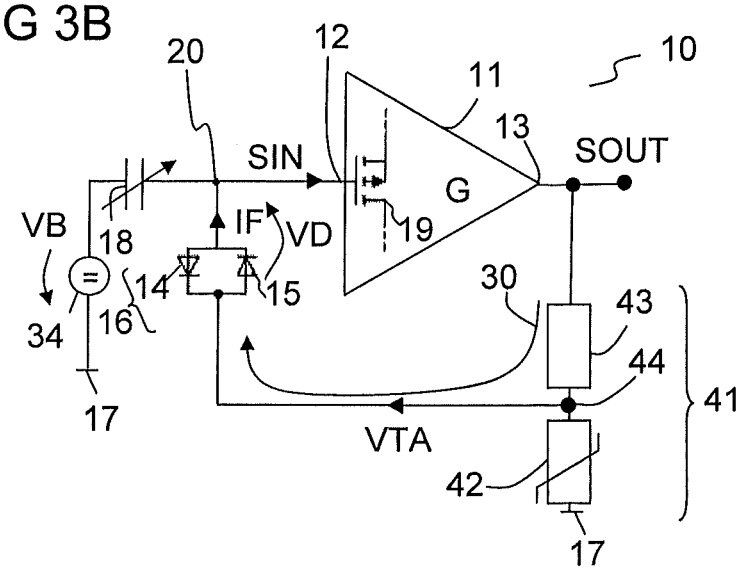

FIG. 3B shows an exemplary sensor amplifier arrangement with a further development of the example shown in FIGS. 1A, 2A, 2C and 3A. The sensor amplifier arrangement 10 comprises the feedback path 30 with a voltage divider 41. The voltage divider 41 couples the signal output 13 to the reference potential terminal 17. The voltage divider 41 comprises a first and a second divider resistor 42, 43. A voltage divider tap 44 of the voltage divider 41 is arranged between the first and the second divider resistor 42, 43. The voltage divider tap 44 is coupled via the anti-parallel circuit of diodes 16 to the signal input 12. The adder 32 and the offset voltage source 31 can be removed. A voltage divider voltage VTA is provided at the voltage divider tap 44. The voltage divider voltage VTA is applied to a terminal of the anti-parallel circuit of diodes 16. The first divider resistor 42 connects to the reference potential terminal 17 and the second divider resistor 43 connects to the signal output 13. The first divider resistor 42 is realized as a variable resistor.

Alternatively, but not shown, the first divider resistor 42 connects to the signal output 13 and the second divider resistor 43 connects to the reference potential terminal 17.

Figure 3C:
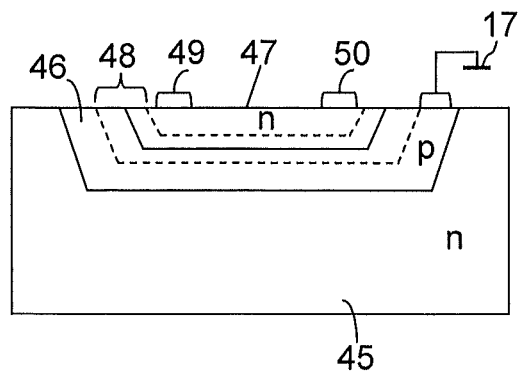

FIG. 3C shows an example of a variable divider resistor. The divider resistor can be inserted as the first or the second divider resistor 42, 43 in FIG. 3B. The variable divider resistor is implemented as a well resistor that is dependent on the voltages applied across the resistor. A semiconductor body 45 comprises the amplifier 11. Moreover, the semiconductor body 45 comprises a well 46 in which a resistor region 47 is arranged. The isolation between the resistor area 47 and the well 46 is achieved by a PN junction. A depletion region of the PN junction separates the resistor region 47 from the well 46. The resistor region 47 and the well 46 have opposite conduction types. A first terminal 49 of the resistor region 47 is, for example, connected to the reference potential terminal 17 and a second terminal 50 of the resistor region 47 connects to the voltage divider tap 44. The width of the depletion region depends on the value of the voltages at the first and the second terminals 49, 50. Therefore, also the cross-section of the resistor region 47 through which a current flows depends on the value of the voltages at the first and the second terminal 49, 50. Thus, the resistance value of the first or second divider resistor 42, 43, respectively, depends on the amplified sensor signal SOUT.

Figure 3D:
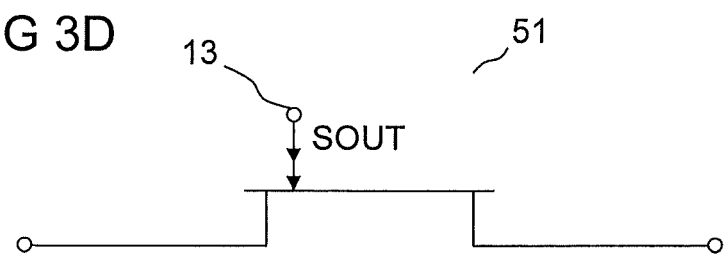

FIG. 3D shows an alternative example of the variable divider resistor. The variable resistor according to FIG. 3D can be inserted as the first or the second divider resistor 42, 43. The resistor is realized as a junction field-effect transistor 51. A control terminal of the junction field-effect transistor 51 is coupled to the signal output 13. Alternatively, but not shown, a control circuit is arranged between the signal output 13 and the control terminal of the junction field-effect transistor 51.

Figure 3E:
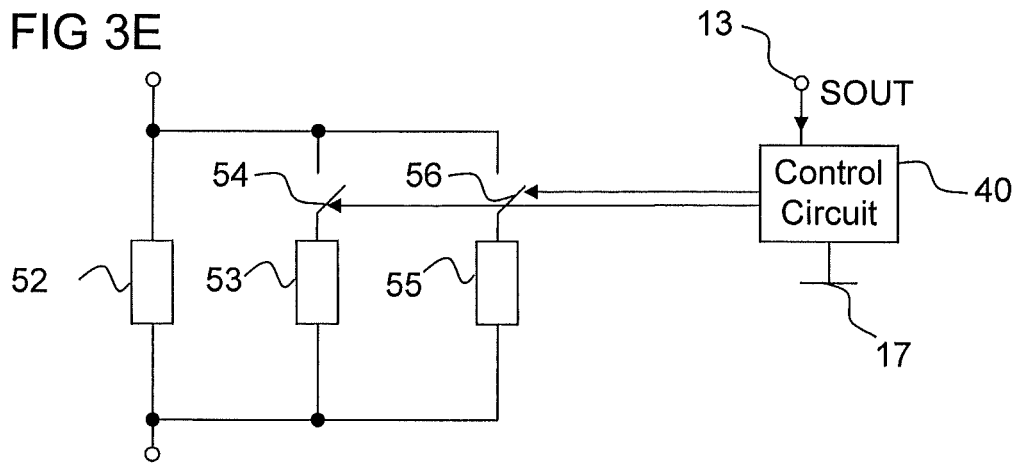

FIG. 3E shows an alternative example of the variable divider resistor which can be used as a first or a second divider resistor 42, 43. The variable divider resistor is implemented as a resistor-switch arrangement. The resistor-switch arrangement comprises a first resistor 52. A series connection of a second resistor 53 and a first switch 54 is arranged in parallel to the first resistor 52. Optionally, a series connection of a third resistor 55 and a second switch 56 connects parallel to the first resistor 52. The first and the second switch 54, 56 are controlled by the control circuit 40. The control circuit 40 connects on its input side to the signal output 13 and to the reference potential terminal 17. A non-linear damping of the sensor signal SIN can be provided with the resistor-switch arrangement and the control circuit 40.

Figure 4A:
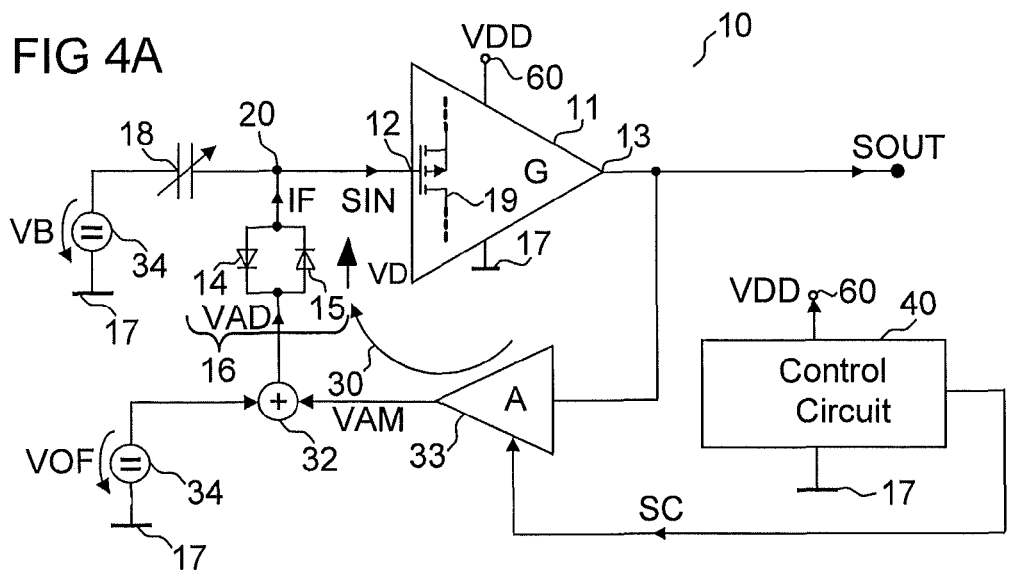

FIG. 4A shows an alternative example of the sensor amplifier arrangement 10 which is a further development of the examples shown in FIGS. 1A, 2A, 2C, 3A and 3B. The control circuit 40 is connected to a supply voltage terminal 60. The supply voltage terminal 60 also connects to the amplifier 11. The amplifier 11 connects to the reference potential terminal 17. A supply voltage VDD is applied to the supply voltage terminal 60. The amplifier 11 operates using the energy provided by the supply voltage VDD via the supply voltage terminal 60. The control circuit 40 generates the control signal SC depending on the value of the supply voltage VDD. The control circuit 40 is implemented as a supply monitor and clipping controller. Thus, the gain of the feedback amplifier 33 is controlled depending on the value of the supply voltage VDD. The sensor amplifier arrangement 10 provides an adaptive input dynamic range control which depends on the supply. The feedback path 30 provides an adaptive loop which selects the gain in the feedback path 30 depending on ambient conditions such as the supply voltage VDD. The dynamic range of the sensor signal SIN can be well defined by this feedback path 30.

Alternatively, the control circuit 40 comprises a temperature sensor. The control signal SC is generated by the control circuit 40 depending on the temperature of the semiconductor body comprising the amplifier 11.

Alternatively, the control circuit 40 is realized as a microcontroller which controls the gain of the feedback amplifier 33. The control signal SC is generated depending on system requirements.

Figure 4B:
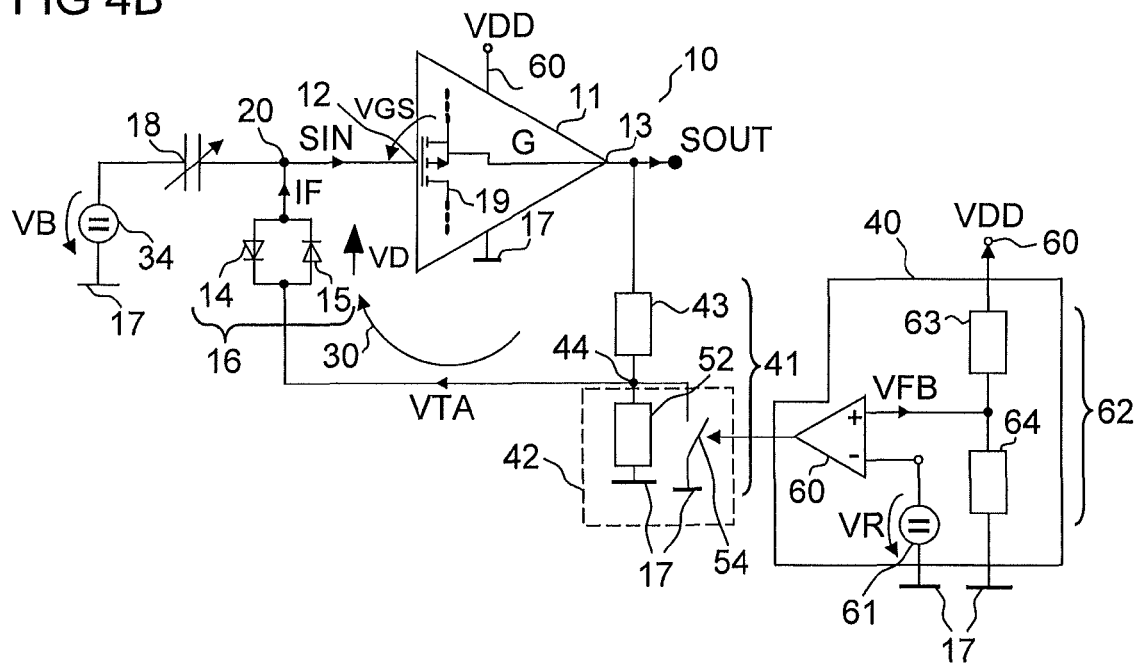

FIG. 4B shows an alternative example of the sensor amplifier arrangement 10 which is a further development of the previous shown examples. The sensor amplifier arrangement 10 comprises the voltage divider 41. The first divider resistor 42 is realized as a resistor-switch combination. The first divider resistor 42 comprises the first resistor 52 and the first switch 54 connected parallel to the first resistor 52. Thus, the parallel circuit of the first resistor 52 and the first switch 54 couples the divider tap 44 to the reference potential terminal 17.

The control circuit 40 comprises a comparator 60 with an output coupled to the control terminal of the first switch 54. A reference voltage source 61 connects to a first input of the comparator 60. The control circuit 40 additionally comprises a detection voltage divider 62 having two resistors 63, 64. The detection voltage divider 62 is arranged between the supply voltage terminal 60 and the reference potential terminal 17. A divider tap of the detection voltage divider 62 connects to a second input of the comparator 60. Thus, the resistance value of the first divider resistor 42 is controlled depending on the value of the supply voltage VDD. In case a voltage VFB at the divider tap of the detection voltage divider 62 is higher than a reference voltage VR of the reference voltage source 61, the first switch 54 is set in a non-conducting state. Thus, the first divider resistor 42 obtains a high resistance value. However, when the feedback voltage VFB is smaller than the reference voltage VR, the first switch 54 is closed and the resistance value of the first divider resistor 42 is reduced to approximately zero.

Alternatively, but not shown, the second resistor 53 connects in series to the first switch 54. In case the first switch 54 is closed, the resistance value of the first divider resistor 42 obtains the resistance value of the parallel circuit of the first and the second resistor 52, 53.

Alternatively, but not shown, the control circuit 40 comprises at least a further comparator and at least a further voltage reference source connected to the at least one further comparator. The first divider resistor 42 comprises at least a further series circuit of a further switch and a further resistor. The series circuit connects in parallel to the first resistor 52. The further switch is controlled by the at least one further comparator.

The clipping level of the first and the second diode 14, 15 can be adaptively changed during operation to adapt for different ambient or supply condition. The sensor amplifier arrangement 10 drives the DC voltage value of the sensor signal SIN actively by an attenuated and optionally inverted version of the amplified sensor signal SOUT. This bootstrapping scheme allows freely adjusting the clipping behavior of the first and the second diode 14, 15. The characteristics of the feedback path 30 are adjustable during operation to automatically adapt to different operating conditions. Thus, the sensor signal SIN has an adjustable dynamic range adjusted during operation. The signal input 12 of the amplifier 11 can have an adjustable dynamic range. The clamping behavior at the signal input 12 of the amplifier 11 is adjusted by bootstrapping or biasing the first and the second diode 14, 15 of the sensor amplifier arrangement 10. The sensor amplifier arrangement 10 is realized as a MEMS microphone amplifier arrangement.

To summarize, the resistance of at least one of the first and the second divider resistor 42, 43 can be controlled by a signal of a group that comprises the amplified sensor signal SOUT, the supply voltage VDD and the temperature.

FIG. 5A shows an alternative example of the sensor amplifier arrangement 10 which is a further development of the above illustrated examples. The sensor amplifier arrangement 10 comprises the amplifier 11 and the feedback path 30 that connects the signal output 13 to the signal input 12. The amplifier 11 comprises a further signal input 70. The further signal input 70 connects to the reference potential terminal 17. The signal input 12 is realized as a non-inverting input, whereas the further signal input 70 is realized as an inverting input. The amplifier 11 receives the sensor signal SIN at the signal input 12 and generates an amplified sensor signal SOUT at the signal output 13. Thus, the amplified sensor signal SOUT is proportional to the sensor signal SIN. The amplified sensor signal SOUT and the sensor signal SIN are formed as voltages relative to the reference potential terminal 17. The amplified sensor signal SOUT is non-inverted with respect to the sensor signal SIN. Non-inverted means that both signals have the same signature.

The feedback path 30 comprises the feedback amplifier 33. The feedback amplifier 33 generates the feedback current IF. The feedback amplifier 33 is implemented as a transconductance amplifier or operational transconductance amplifier 69, abbreviated OTA. The feedback amplifier 33 transfers the amplified sensor signal SOUT that has the form of a voltage into the feedback current IF. Furthermore, the feedback path 30 comprises an inverting buffer 71 which couples the signal output 13 to an input of the feedback amplifier 33. The inverting buffer 71 has an amplification factor of −1. The feedback current IF is a current that flows in the direction of a node 20 between the sensor 18 and the signal input 12. The feedback current IF is positive if it flows in the direction of the node 20. The node 20 is also called sensor output. The feedback current IF is inverted in respect to the amplified sensor signal SOUT and, therefore, also to the sensor signal SIN. The feedback current IF is positive if the amplified sensor signal SOUT and the sensor signal SIN are negative and vice versa. The feedback current IF is attenuated with respect to the amplified sensor signal SOUT. This is achieved by a low gain gm of the feedback amplifier 33. Thus, the feedback current IF follows the equations:

$$IF = A \cdot SOUT; A < 10^{-3} \cdot \frac{A}{V}; \operatorname{sign}(IF) = -\operatorname{sign}(SIN);$$

wherein A is the amplification factor of the feedback path 30, sign(IF) is the signature of the feedback current and sign (SIN) is the signature of the sensor signal. The amplification factor A is equal to the transconductance gm of the feedback amplifier 33. Alternatively, the amplification factor A is less than $10^{-6}$ A/V or less than $10^{-9}$ A/V. The feedback current IF is an attenuated signal derived from the amplified sensor signal SOUT that has the form of a voltage. The feedback current IF depends from the amplified sensor signal SOUT in a linear fashion. Since the feedback current IF only obtains very small values even if the amplified sensor signal SOUT is in the range of some Volt, the feedback signal IF is attenuated with respect to the amplified sensor signal SOUT. The attenuation of the feedback current IF in relation to the amplified sensor signal SOUT is expressed by the amplification factor A.

The sensor amplifier arrangement 10 additionally comprises the analog-to-digital converter 35 which connects the signal output 13 to a digital signal output 72. The analog-to-digital converter 35 is optional. The biasing voltage source 34 is connected to the signal input 12 via the sensor 18. The sensor 18 is a capacitive sensor. The capacitance value of the sensor 18 depends on the parameter which has to be measured. A voltage (VB-SIN) can tapped across the sensor 18. Since the voltage (VB-SIN) across the sensor 18 is different from 0, the change of the capacitance of the sensor 18 causes a current flow which results in a change of the sensor signal SIN.

The feedback current IF provided by the feedback path 30 gradually starts to flow with increasing value of the amplified sensor signal SOUT and with decreasing value of a frequency of the amplified sensor signal SOUT. The sensor amplifier arrangement 10 filters out low frequency components in the 10 Hz range and below, including especially DC, to keep them from using up the available dynamic range of the amplifier 11 and the analog-to-digital converter 35, but without contributing to the signal of interest. The sensor amplifier arrangement 10 feeds the controlled feedback current IF into the capacitive sensor 18 to achieve a low frequency signal filtering and a constant voltage biasing of the sensor 18. The sensor output 20 is directly regulated by the OTA 69 with very low gm. The capacitance of the sensor 18 is continuously charged and regulated towards zero, which creates the desired high-pass filtering. Such a direct connection of the OTA 69 to the sensor output 20 is feasible at sensors 18 with large capacitance and large signal amplitudes.

FIG. 5B shows an alternative example of the sensor amplifier arrangement 10 which is a further development of the above shown examples. The sensor 18 is realized as a photodiode 74. The sensor signal SIN is a sum of the current of the photodiode 74 and the feedback current IF. The feedback current IF can be used to reduce the influence of constant background light such that the amplified sensor signal SOUT can follow fast signals, for example, in case of an optical signal transmission.

FIG. 5C shows an alternative example of the sensor amplifier arrangement 10 which is a further development of the above shown examples. The signal input 12 of the amplifier 11 is realized as an inverting input, whereas the further signal input 70 is realized as a non-inverting input. Thus, the amplified sensor signal SOUT is inverted with respect to the sensor signal SIN. The inverting buffer 71 is not arranged in the feedback path 30. The feedback amplifier 33 couples the signal output 13 to the signal input 12. The OTA 69 comprises an input coupled to the signal output 13 and an output coupled to the signal input 12. The feedback current IF is not inverted with respect to the amplified sensor signal SOUT. However, the feedback current IF is inverted with respect to the sensor signal SIN. Due to the low gain of the feedback amplifier 33, which is implemented as the OTA 69, the feedback current IF is an attenuated signal of the amplified sensor signal SOUT.

Figure 6A:
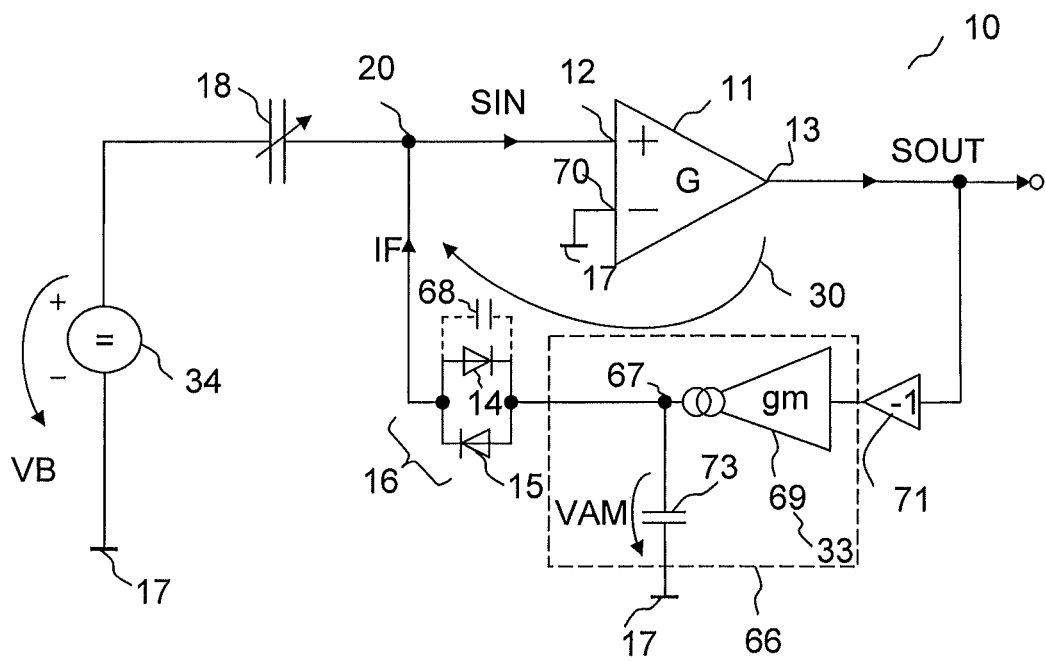
FIGS. 6A to 6C show an example of a sensor amplifier arrangement and signal-time diagrams of signals of the sensor amplifier arrangement.

FIG. 6A shows an alternative example of the sensor amplifier arrangement 10 which is a further development of the above shown examples. The sensor 18 is realized as a MEMS microphone. Thus, the sensor signal SIN generated by the sensor 18 depends on the sound. The feedback path 30 comprises the anti-parallel circuit of diodes 16 which couples the output of the feedback amplifier 33 to the signal input 12. An additional capacitor 68 is arranged parallel to the anti-parallel circuit of diodes 16. The additional capacitor 68 represents the parasitic capacitance of the diodes 14, 15. The feedback path 30 comprises an integration capacitor 73 having a first terminal coupled to the output of the feedback amplifier 33. Thus, the feedback path 30 comprises the integrator 66. The integrator 66 is formed by the integration capacitor 73 and the feedback amplifier 33 that comprises the OTA 69. The current provided by the feedback amplifier 33 is integrated by the integration capacitor 73. The amplifier voltage VAM is applied across the integration capacitor 73. The amplifier voltage VAM is an attenuated signal of the amplified sensor signal SOUT and is inverted with respect to the sensor signal SIN. The feedback current IF depends from the amplified sensor signal SOUT in a non-linear fashion. The non-linearity is caused by the anti-parallel circuit of diodes 16 and the integration capacitor 73.

The reduction of DC and low frequency signals in the sensor signal SIN is achieved with the analog integrator 66 with non-critical noise performance together with the anti-parallel circuit of diodes 16. This reduces the voltage uncertainty at the sensor 18 for better sensor gain accuracy. The sensor amplifier arrangement 10 feeds the feedback current IF into the sensor output 20 of the sensor 18 without degrading its node impedance and the noise performance. The controlled side of the anti-parallel circuit of diodes 16 remains silent in the frequency range of interest due to the slow response of the integrator 66 which is essential to provide the required low-pass filtering. The feedback path 30 creates a low-pass filter by feeding the controlled feedback current IF into the high impedance sensor output 20. The arrangement 10 makes this feasible also for small sensor capacitors such as some 1 pF and less, and tight noise requirements, some 100/ and less, because feeding current into a small capacitor could quickly degrade noise performance. One single electron having a charge $1.6 \cdot 10^{-19}$ As already changes a 1 pF capacitor's voltage by 0.16 µV.

The sensor amplifier arrangement 10 can be implemented in sensor systems in general and audio applications in particular. For example, a DC component on top of some useful audio waveform could drive the audio amplifier 11 close to its maximum level, leaving little room for the desired audible signal. In MEMS microphones with a capacitive MEMS sensor 18 and interface ASIC, DC components and slow settling transients at the output of the sensor 18 can be particularly large because of the high impedance voltage biasing required at the output of the sensor 18. This adds special emphasis on including a filter for the low frequency components into the interface ASIC. In MEMS microphones with digital output, the sensor output voltage SIN needs to be amplified before being fed into the analog-to-digital converter 35 to achieve a feasible noise performance. As a consequence, the unused low frequency and DC components must be filtered out already at the sensor output 20, which means before the amplification, to avoid saturation of the amplifier 11 or reduction of the usable dynamic range. The sensor amplifier arrangement 10 provides the high impedance required at the sensor output 20. The low frequency high-pass filtering is directly performed at the sensor output 20 by feeding in the controlled feedback current IF that removes the low frequency components, but still maintaining the high impedance to avoid noise degradation from thermal noise.

It is advantageous that a filter with critical noise performance is not required. This saves circuit area, for example, for a large capacitor. Slow voltage transients or large biasing offsets from leakage currents at the sensor output 20 are eliminated which improves the MEMS sensor gain accuracy, temperature drift and measurement repeatability. The sensor gain of the sensor 18 depends on the voltage across the sensor 18. A quick recovery from a "rough case" occurs: If the sensor output voltage is forced to a maximum which might cause the allowed input voltage range of the amplifier 11 to be exceeded, for example, due to some mechanical sensor impact or sensor short circuit event, the active regulation at the sensor output 20 will efficiently regulate away the excess charge and thereby quickly restore the normal operation of the amplifier 11. A special rough case detection circuit is not required. Like in the "rough case," there is no special startup logic required for sensor biasing voltage initialization because the sensor output voltage is quickly and automatically regulated to the desired value.

The sensor amplifier arrangement 10 implements an amplitude sensitive low frequency filtering: The anti-parallel circuit of diodes 16 introduces an amplitude dependent high-pass filter corner frequency. The corner frequency rises with rising amplitude of the amplified output signal SOUT. At high signal amplitudes, the corner frequency converges to the frequency defined by the amplifier 11 and the integrator 66, whereas at lower amplitudes the corner frequency decreases down to a ratio defined by the capacitance of the sensor 18 and the junction capacitance of the diodes 14, 15. This gives the benefit that at least for low amplitudes low frequency signals can be processed, while still maintaining the ability to quickly remove large transients. There is a pole followed by a zero in the transfer function which both depend on the differential resistance of the diodes 14, 15 at the given diode voltage VD.

The sensor amplifier arrangement 10 directly feeds current into the sensor output 20 between the sensor 18 and the signal input 12 to achieve a low frequency high-pass filter functionality and accurate sensor biasing. The arrangement 10 uses bipolar diodes 14, 15 to maintain the high impedance and noise performance. The sensor amplifier arrangement 10 controls the sensor output voltage by slowly injecting charge such that low frequency components of the original sensor signal are suppressed. This is done by feeding the inverted output of the amplifier 11 into the integrator 66 comprising the integration capacitor 73 and the OTA 69 with low gm. A node 67 at the output of the integrator 66 slowly tracks the inverted signal output. The anti-parallel circuit of diodes 16 then ensures that the feedback current IF is fed gradually into the high impedance sensor output 20, if the voltage difference between the node 67 and the sensor output 20 is becoming larger. This provides a "smooth" charge transfer with low shot noise at the sensor output 20 and maintains the high impedance at the sensor output 20 for low voltage differences, now counteracting low frequency signal components at the sensor output 20. Noise at node 67 will be efficiently suppressed to the sensor output 20 at low voltage differences.

The sensor amplifier arrangement 10 can be used for any capacitive sensor interface circuit topology which requires controlled charge to be fed into the high impedance sensor node, for example, a sensor charge integrator topology. The feedback path 30 with integrator 66 and diode pair 14, 15 can be applied to any amplifier topology that interfaces to a small capacitive sensor 18 and requires controlling of the charge at the sensor 18. The sensor signal SIN sees a high-pass cut-off frequency. Two poles and one zero are acting together. Moreover, the high-pass cut-off frequency depends on the amplitude of the diode voltage VD across the pair of diodes 14, 15 due to its non-linear I-V characteristic.

The feedback path 30 feeds the controlled feedback current IF into the capacitive sensor 18 through the anti-parallel circuit of diodes 16 to reduce the noise degradation from current noise at small sensor capacitors. The feedback path 30 comprises a series connection of the anti-parallel circuit of diodes 16 and the integrator 66 to achieve low frequency signal filtering with a noise-uncritical integrator 66.

The MEMS microphone sensor 18 obtains a capacitance value that is typically less than 1 pF. The required noise performance is <10 μV in the audio band. The feedback path 30 is a sensor current feeder implementation with two diodes 14, 15. The output of the integrator 66, built by the OTA 69 and the integration capacitor 73, feeds into the anti-parallel circuit of diodes 16 which in turn feed the feedback current IF into the sensor output 20. The feedback path 30 has a low-pass characteristic. This results in a high-pass characteristic of the sensor amplifier arrangement 10. The −3 dB corner frequency of the high-pass rises with increasing diode (DC−) voltage VD that means the corner frequency raises with the sensor signal SIN.

Alternatively, the additional capacitor 68 is realized as a circuit element. The additional capacitor 68 does not represent the capacitance of the diodes 14, 15.

Figure 6B:
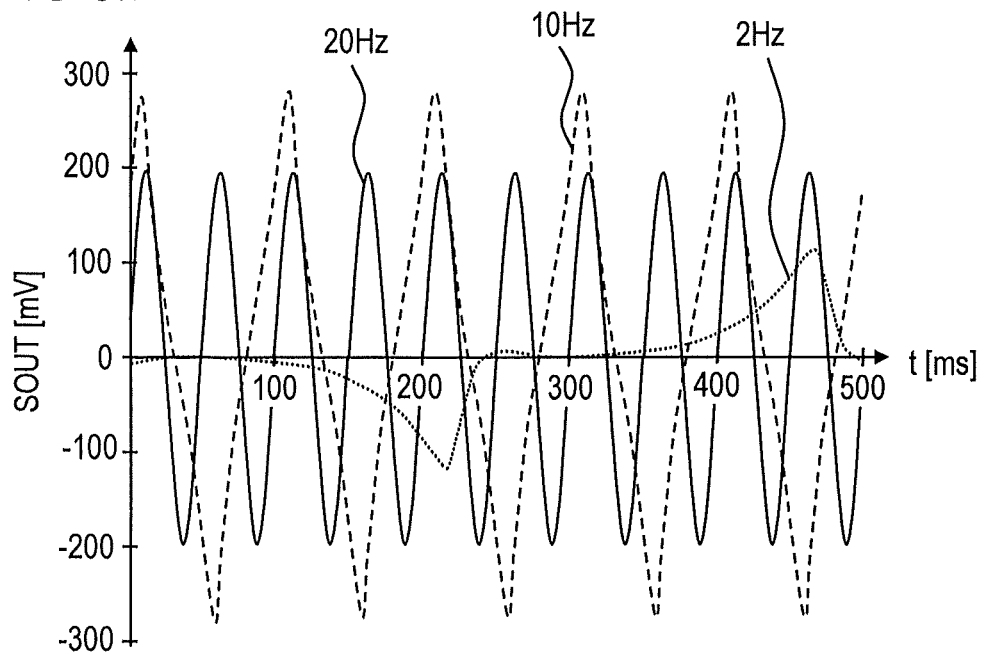
Figure 6C:
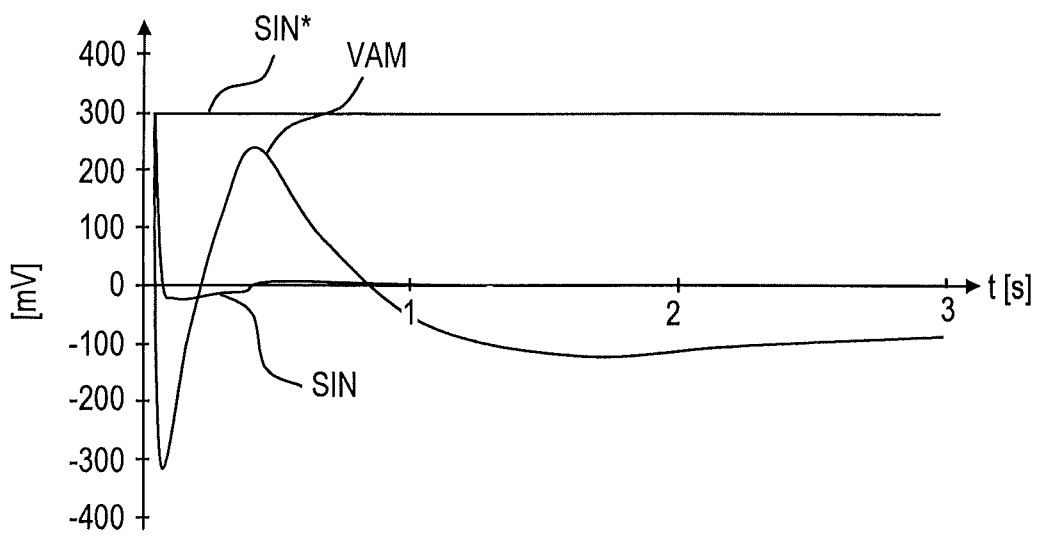

FIGS. 6B and 6C show exemplary signal-time diagrams of signals of the sensor amplifier arrangement 10. Signals SOUT1, SOUT2, SOUT3 are shown in FIG. 6B which are simulated amplified sensor signals SOUT for sine wave sensor signals SIN at 2 Hz, 10 Hz and 20 Hz. The pole frequency has a value of 15.9 Hz. The sensor signal SIN having a frequency of 2 Hz is attenuated and shows a large distortion. A peaking occurs for the sensor signal SIN at 10 Hz. At 20 Hz, the sensor signal SIN results in an undistorted and un-attenuated amplified sensor signal SOUT.

In FIG. 6C the simulation of a step response is illustrated. A signal SIN* shows the step with a large value of an unloaded sensor 18. With the sensor amplifier arrangement 10 shown in FIG. 6A, the sensor signal SIN is quickly regulated back to approximately zero after the triggering point of the step and the amplifier voltage VAM is reduced to zero within several seconds after the triggering point of the step. Most of the step is regulated away quickly. The remaining step of the sensor signal SIN is less than 10% after 60 ms. The remaining part is removed within several seconds.

In spite of the complex relationship, a cut-off frequency ffb can be sufficiently controlled by changing the gain of the integrator 66, as long as the signal does not exceed a certain amplitude, for example, 300 mVpp. The cut-off frequency ffb is advantageously kept below the pole ffb created by the feedback loop which can be calculated according to the following equation:

$$ffb = A \cdot gm/(2 \cdot \pi \cdot Cint);$$

wherein Cint is the capacitance value of the integration capacitor 73. The minimum cut-off frequency $f_{c,min}$ for very small amplitudes is determined by the capacitance Cj of the diodes 14, 15 and the total capacitance Csensout because of the feed forward path from the node 67 to the sensor output 20. The minimum cut-off frequency $f_{c,min}$ can be calculated according to the following equation:

$$fc,min = ffb \cdot Cj/(Cj + Csensout).$$

Due to the non-linear I-V characteristic, signals will be attenuated differently at different amplitudes, leading to distortion. Nevertheless, this only applies to signals below the cut-off frequency $f_c$, whereas signals well above the cut-off frequency $f_c$ are not affected as long as their amplitude does not exceed a predetermined amplitude. The transient simulation of FIG. 6B for a large sensor sine wave signal, for example, 200 mVp, uses three different frequencies around the pole frequency ffb=A*gm/(2*π*Cint) which had been selected ffb=15.9 Hz. Attenuation is observed at 2 Hz and a peaking, for example, >200 mVp is recognized at 10 Hz. The signals at 2 Hz and 10 Hz are less than the pole frequency ffb and are distorted. An undistorted and un-attenuated signal is observed at f=20 Hz>ffb. The gmC filter is a slow integrator 66 composed of the OTA 69 with very low transconductance gm and the large integration capacitor 73 which tries to follow the amplifier output 13 and thus forms the feedback path 30 for low frequency components. Therefore, the voltage signal at the sensor output 20 is first order high-pass filtered with the corner frequency ffb and the amplifier 11 needs to process the high frequency signal components only.

Referring to stability considerations, the feedback path 30 into the sensor output 20 provides a closed regulation loop, which is stable if the Nyquist plot of the open loop gain does not encircle the point −1+0j, derived from Nyquist stability criterion. The open loop of the sensor amplifier arrangement 10 consists of a cascade of the amplifier 11, the integrator 66 and the anti-parallel circuit of diodes 16. The maximum frequency where the gain of this loop drops below unity is set to the required high-pass cut-off frequency, which is typically low enough to neglect the phase shift of the amplifier 11, for example, at 20 Hz. The integrator 66 has a phase shift of −90°. The anti-parallel circuit of diodes 16 introduces a further shift of up to some −70° depending on the diode voltage VD and frequency. Although the open loop Nyquist plot can come "close" to the point −1+0j at certain diode voltages VD, it can never encircle it. Thus, the loop is inherently stable but might tend to have decaying low frequency oscillations, which is confirmed by the sine wave time plot in FIG. 6B and the step response plot in FIG. 6C. Gain "peaks" above 0 dB under certain conditions. As shown in FIG. 6B, the signal amplitude can become larger than the original signal amplitude. In an audio system, these oscillations are not critical because they are not audible.

The ESD protection for the sensor output 20 can be implemented indirectly at the node 67, which ensures that its leakage current is not degrading the noise performance at sensor output 20. The anti-parallel circuit of diodes 16 can be designed to support the current of an ESD event.

Figure 7:
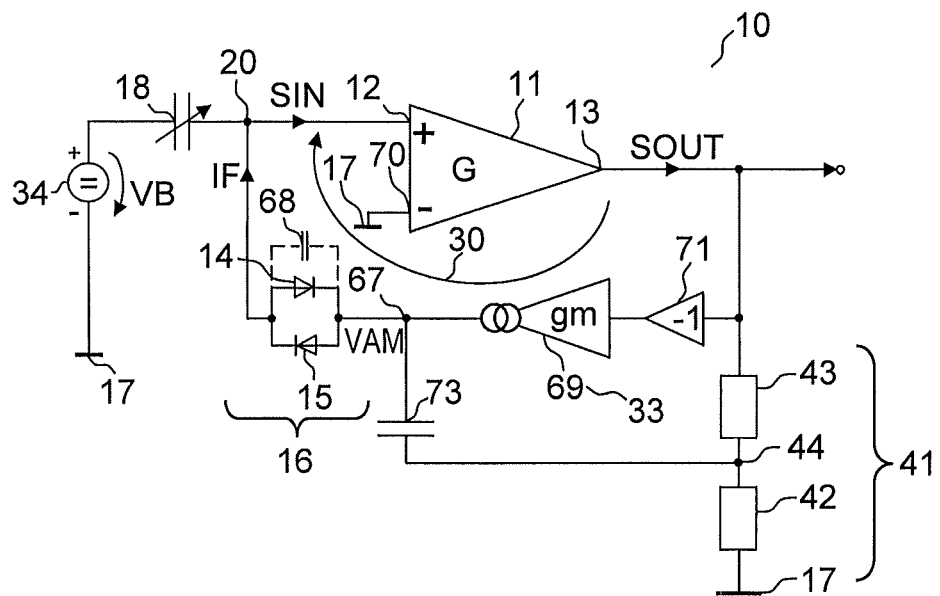
FIGS. 7 and 8 show examples of sensor amplifier arrangements.

FIG. 7 shows an alternative example of the sensor amplifier arrangement 10 which is a further development of the above shown examples. The feedback path 30 comprises the voltage divider 41 that couples the signal output 13 to the reference potential terminal 17. The voltage divider tap 44 between the first and the second voltage divider resistor 42, 43 is coupled via the integration capacitor 73 to the node 67 between the feedback amplifier 33 and the anti-parallel circuit of diodes 16. The integration capacitor 73 has the effect that the amplifier voltage VMA at the output of the feedback amplifier 33 quickly changes in case of a change of the value of the amplified sensor signal SOUT. The voltage divider 41 determines the attenuation of the rise of the amplifier voltage VMA in case of a rise of the amplified sensor signal SOUT.

The bootstrapping makes the anti-parallel circuit of diodes 16 follow the signal voltage also at the node 67 for baseband signals by an attenuated version of the baseband signal. This is achieved by the integration capacitor 73 which forms a forward path to the node 67 for baseband signals. As a result, the characteristics of the diodes 14, 15 are stretched for baseband signals which means that the baseband signal at the sensor output 20 can become larger before the diodes 14, 15 start to conduct and introduce signal distortion. This extends the allowed maximum signal range. The feedback path 30 uses a bootstrapping scheme to extend the maximum signal. Thus, the impact of the diodes 14, 15 in the baseband is reduced. The bottom terminal of the integration capacitor 73 is connected to an attenuated version of the amplified sensor signal SOUT, which is then forward-fed into the node 20 by the integration capacitor 73.

Therefore, the node 67 follows the sensor output 20 for baseband frequency signals performing the bootstrapping method. The node 67 is at the controlled side of the anti-parallel circuit of diodes 16. A fast signal change of the sensor signal SIN generates a fast change of the amplified sensor signal SOUT that results in a fast change of the amplifier voltage VAM. Therefore, the change of the feedback current IF is smaller in case of fast changes in comparison to slow changes of the sensor signal SIN. The distortion of loud acoustic signals is reduced. The bootstrapping is realized by fast signals at the controlled side of the anti-parallel circuit of diodes 16. The regulation using the feedback path 30 is not only advantageous for DC-biasing, but also for high-speed requirements such as a improved total harmonic distortion, adaption to noise caused by wind, adaption to changes of the supply voltage VDD and bootstrapping.

Figure 8:
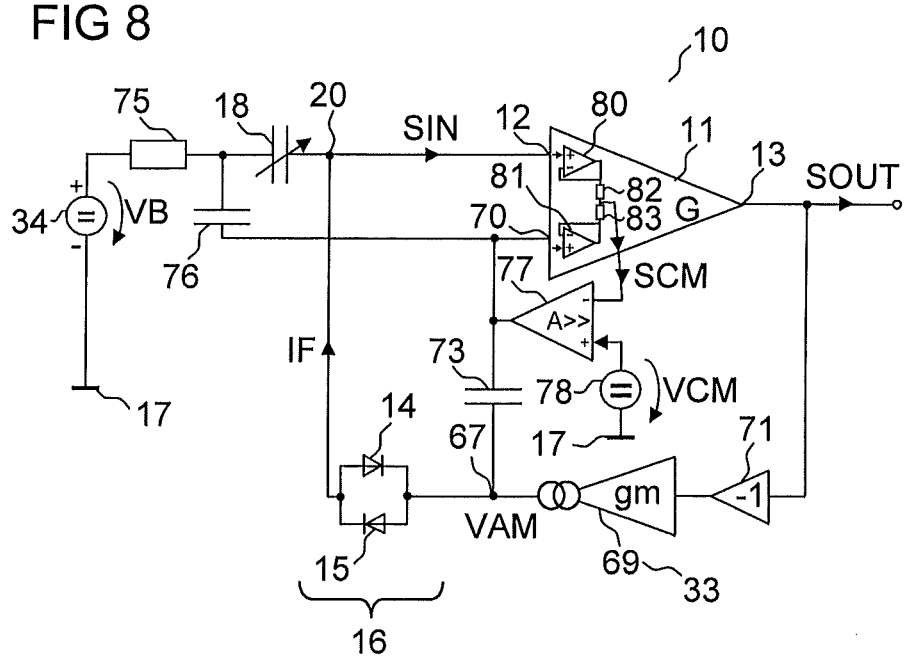

FIG. 8 shows an alternative example of the sensor amplifier arrangement 10 which is a further development of the above shown example. The amplifier 11 comprises the signal input 12 and the further signal input 70. The integration capacitor 73 couples the node 67 between the feedback amplifier 33 and the anti-parallel circuit of diodes 16 to the further signal input 70. The sensor amplifier arrangement 10 comprises an additional capacitor 76 which couples the further signal input 70 to a node between the biasing voltage source 34 and the sensor 18. Moreover, the sensor amplifier arrangement 10 comprises a source resistor 75 arranged between the biasing voltage source 34 and the sensor 18. The additional capacitor 76 couples the further signal input 70 to a node between the source resistor 75 and the sensor 18.

The amplifier 11 comprises a first and a second input stage 80, 81. The first input stage 80 connects to the signal input 12 and the second input stage 81 connects to the further signal input 70. The first and the second input stages 80, 81 are coupled on their output sides to a further output 79 of the amplifier 11. A first input of the first input stage 80 connects to the signal input 12. A second input of the first input stage 80 connects to the output of the first input stage 80 which is coupled to the further output 79 of the amplifier 11 via a first input stage resistor 82. A first input of the second input stage 81 connects to the further signal input 70. A second input of the second input stage 81 connects to the output of the second input stage 81 which is coupled to the further output 79 of the amplifier 11 via a second input stage resistor 83.

Moreover, the sensor amplifier arrangement 10 comprises a regulator 77 coupled on its output side to the further input 70 of the amplifier 11. A first input of the regulator 77 is coupled to a regulator reference source 78. A second input of the regulator 77 connects to the further output 79 of the amplifier 11. The regulator 77 is realized as an amplifier. The regulator 77 is designed as a common mode regulator. The amplifier 11 generates a common mode signal SCM at the further output 79. A common mode reference voltage VCM of the regulator reference source 78 and the common mode signal SCM are provided to the inputs of the regulator 77.

The sensor amplifier arrangement 10 realizes a common mode regulation scheme. Thus, the common mode voltage at the amplifier's input is kept constant, resulting in an equal distribution of the sensor signal to both inputs 12, 70 as a differential signal. The input voltage common mode regulation reduces the signal swing at the amplifier input stage by 6 dB by distributing the signal to both amplifier inputs 12, 70 in the form of the differential signal. This gives room for higher maximum signal support or controlling the amplifier 11 in terms of noise or the like. The common mode voltage regulation scheme reduces the required input voltage range of the amplifier 11. The further input 70 of the amplifier 11 is regulated by a common mode regulator 69 with large gain such that the input common mode voltage is kept at a constant value. The input common mode voltage is the average of the voltages at the signal input 12 and the further signal input 70 and is represented by the common mode signal SCM at the further output 79 of the amplifier 11. The actual input common mode voltage is derived inside the amplifier 11.

The additional capacitor 76 and the source resistor 75 are designed such that their corner frequency is below the signal frequency range of interest, resulting in a feed forward path with gain=1 from the node between the additional capacitor 76 and the source resistor 75 to the further input 70 of the amplifier 11. Noise of the regulator 77 or the regulator reference source 78 is not very critical, since it only affects the common mode input voltage of the amplifier 11.

Figure 9A:
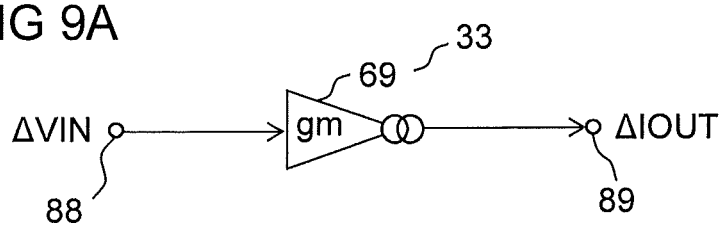
FIGS. 9A to 9C show examples of a transconductance amplifier.

FIG. 9A shows an example of the feedback amplifier 33. The feedback amplifier 33 is realized as an OTA 69. The feedback amplifier 33 illustrated in FIGS. 9A to 9C can be implemented in the sensor amplifier arrangement 10 shown in FIGS. 2A, 2C, 3A, 3B, 4A, 5A to 5C, 6A, 7 and 8. The OTA 69 comprises an input 88 and an output 89. A voltage ΔVIN is applied to the input 88 of the OTA 69. The OTA 69 generates a current ΔIOUT at the output 89. The current ΔIOUT follows the following equation:

$$\Delta IOUT = \Delta VIN \cdot gm;$$

wherein gm is the amplification factor of the OTA 69.

Figure 9B:
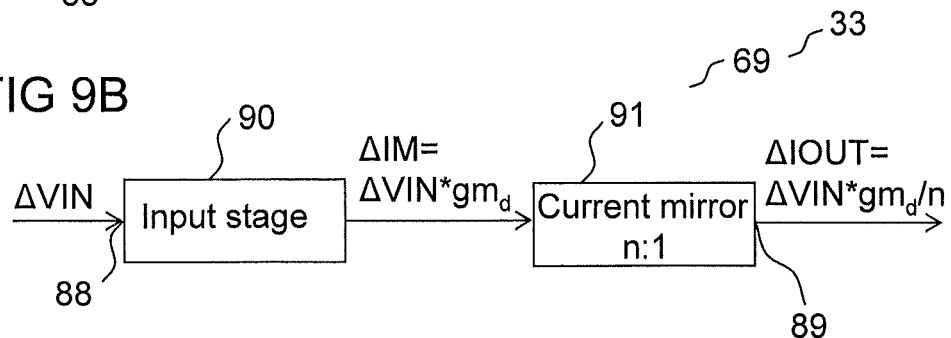

FIG. 9B shows a block diagram of the feedback amplifier 33. The OTA 69 comprises an input stage 90 connected to the input 88 of the OTA 69. Furthermore, the OTA 69 comprises a current mirror 91 which couples the input stage 90 to the output 89 of the OTA 69. The input stage 90 generates an intermediate current ΔIM. The current mirror 99 reduces the intermediate current ΔIM by a current reduction factor n and generates the output current ΔIOUT. The output current ΔIOUT and the intermediate current ΔIM can be calculated according to the following equations:

$$\Delta IM = \Delta VIN \cdot gm_d; \Delta IOUT = \Delta IM \cdot \frac{1}{n} = \Delta VIN \cdot \frac{gm_d}{n};$$

wherein $gm_d$ is the amplification factor of the input stage 90 and n is the current reduction factor of the current mirror 91.

Figure 9C:
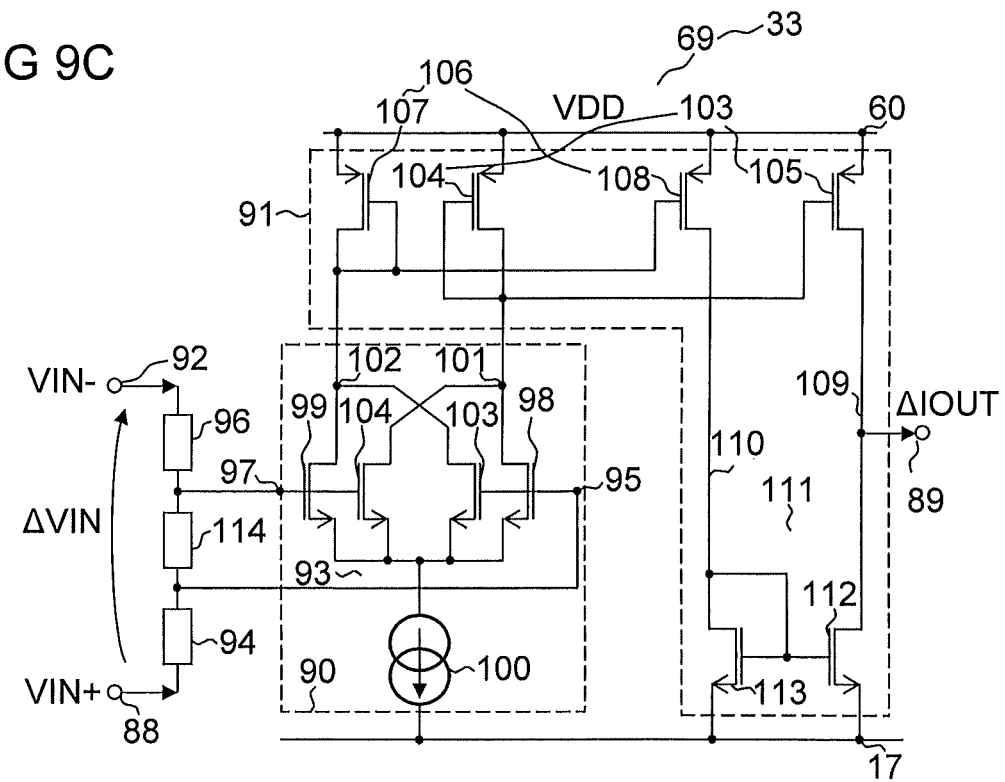

FIG. 9C shows the feedback amplifier of FIGS. 9A and 9B in more detail. The input stage 90 has a further input 92. Moreover, the input stage 90 comprises a differential stage 93. The input 88 of the OTA 69 is coupled via a first resistor 94 to a first input 95 of the differential stage 93. The further input 92 of the OTA 69 is coupled via a second resistor 96 to the second input 97 of the differential stage 93. The input stage 90 comprises a third resistor 114 arranged between the first and the second resistor 94, 96. The differential stage 93 comprises a first and a second transistor 98, 99 and a current source 100. The first and the second inputs 95, 97 of the differential stage 93 are coupled to the control terminals of the first and the second transistor 98, 99. A first terminal of the first and the second transistor 98, 99 each connect to a common node coupled via the current source 100 to the reference potential terminal 17. A second terminal of the first transistor 98 connects to a first output 101 of the differential stage 93 and a second terminal of the second transistor 99 connects to a second output 102 of the differential stage 93.

The differential stage 93 comprises a third and a fourth transistor 103, 104 which each have a first terminal connected to the common node. The third transistor 103 comprises a control terminal connected to the first input 95 of the differential stage 93 and a second terminal connected to the second output 102 of the differential stage 93. The fourth transistor 104 has a control terminal connected to the second input 97 of the differential stage 93 and a second terminal connected to the first output 101 of the differential stage 93.

The first and the second output 101, 102 of the differential stage 93 are coupled via the current mirror 91 to the output of the OTA 69. The current mirror 91 comprises a first current mirror circuit 103 which comprises a first and a second current mirror transistor 104, 105. The first current mirror transistor 104 couples the first output 101 of the input stage 90 to the supply voltage terminal 60. Correspondingly, the current mirror 91 comprises a second current mirror circuit 106 formed by a third and a fourth current mirror transistor 107, 108. The third current mirror transistor 107 couples the second output 102 of the input stage 90 to the supply voltage terminal 60.

The current mirror 91 comprises a first and a second output path 109, 110. A node in the first output path 109 connects to the output 89 of the OTA 69. Moreover, the current mirror 91 comprises a third current mirror circuit 111 formed by a fifth and a sixth current mirror transistor 112, 113. The first output path 109 comprises the second current mirror transistor 105 and the fifth current mirror transistor 112. The second output path 110 comprises the fourth current mirror transistor 108 and the sixth current mirror transistor 113. A node between the second and the fifth current mirror transistor 105, 112 connects to the output 89 of the OTA 69.

The OTA 69 is designed such that it achieves a low transconductance gm. For this reason, the OTA 69 has at least one of the following features: The input stage 90 comprises a counter phase differential pair. According to FIG. 9C, the counter phase differential pair is formed by the first, second, third and fourth transistor 98, 99, 103, 104. The transistors of the OTA 69 are implemented as field-effect transistors. The transistors of the OTA 69 are realized as metal-oxide-semiconductor field-effect transistors. The input stage 90 comprises a differential transistor pair which is realized as field-effect transistors having a small width-to-length ratio. The first to the fourth transistor 98, 99, 103, 104, therefore, obtain a small width-to-length ratio. The OTA 69 is designed with a low bias current. For this reason, the current source 100 is implemented to provide a current with a small value.

The input stage 90 comprises input signal attenuation. The input signal attenuation is realized by a resistor divider. The resistor divider is formed by the first, the second and the third resistor 94, 96, 114. The OTA 69 obtains a large current mirror ratio n:1. The number n is very high in comparison to 1. For this reason, the first current mirror transistor 104 is designed having a larger width-to-length ratio in comparison to the second current mirror transistor 105. Similarly, the third current mirror transistor 107 has a larger width-to-length ratio in comparison to the fourth current mirror transistor 108.

In FIG. 9C, an example of an OTA 69 is illustrated which combines the above-mentioned techniques to achieve a low transconductance gm. However, alternative examples of an OTA 69 can be inserted in the sensor amplifier arrangement 10 shown above which implement only one technique to achieve a low transconductance gm or which will not use any of the above-mentioned techniques.

Figure 10:
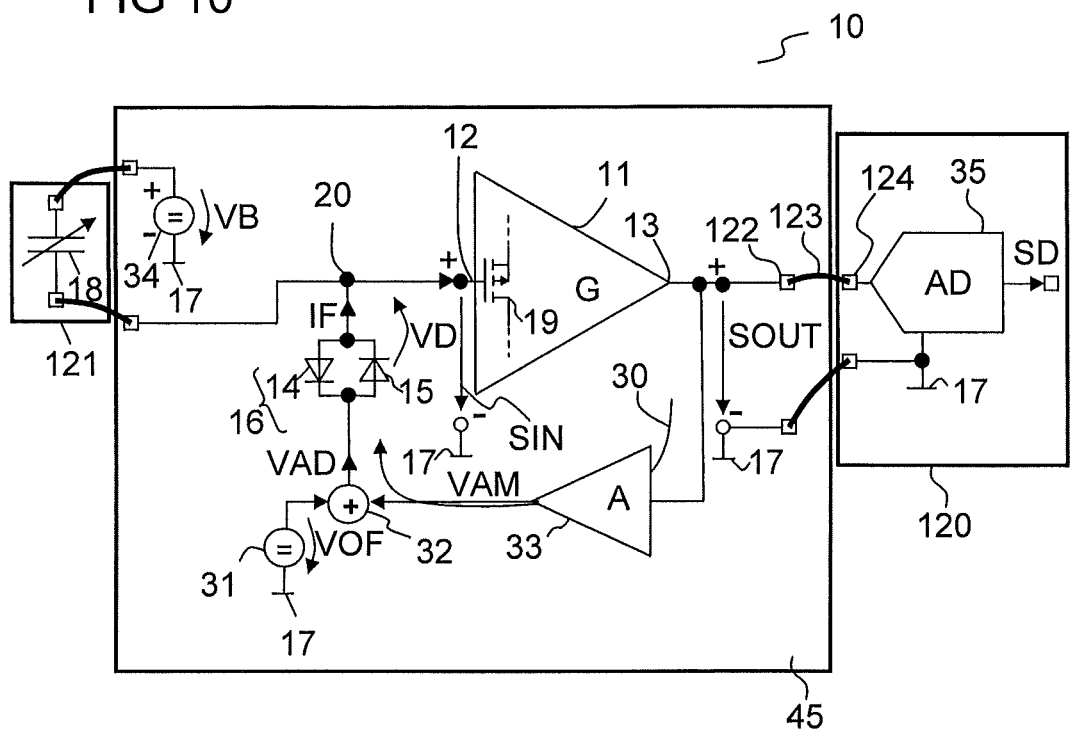
FIG. 10 shows an example of a sensor amplifier arrangement.

FIG. 10 shows an example of the sensor amplifier arrangement 10 which is a further development of the above shown example. The sensor amplifier arrangement 10 comprises the semiconductor body 45 which comprises the amplifier 11 and the feedback path 30 according to one of the examples illustrated in FIGS. 2A, 2C, 3A, 3B, 4A, 4B, 5A to 5C, 6A, 7 and 8. Moreover, the semiconductor body 45 comprises the biasing voltage source 34. The sensor amplifier arrangement 10 comprises a further semiconductor body 120 having the analog-to-digital converter 35. The signal output 13 of the amplifier 11 is coupled via a pad 122 of the semiconductor body 45, a bonding wire 123 and a pad 124 of the further semiconductor body 120 to the input of the analog-to-digital converter 35. The sensor amplifier arrangement 10 comprises an additional semiconductor body 121 with the sensor 18. The sensor 18 is implemented as a microphone. The additional semiconductor body 121 is realized as a micro-electro-mechanical system and is fabricated by micro-machining.

Alternatively, but not shown, the semiconductor body 45 also comprises the analog-to-digital converter 35.

Alternatively, but not shown, a separate semiconductor body comprises the biasing voltage source 34.

The scope of protection of this disclosure is not limited to the examples given above. Our arrangements and methods are described in each novel characteristic and in each combination of characteristics, which includes every combination of any features which are stated in the appended claims, even if the combination of features is not explicitly stated in the claims. The scope of the disclosure includes a combination of the above illustrated examples.

The invention claimed is:

1. A sensor amplifier arrangement comprising:
an amplifier having a signal input to receive a sensor signal and a signal output to provide an amplified sensor signal, and
a feedback path that couples the signal output to the signal input and comprises
an anti-parallel circuit of diodes,
an offset signal source, and
an adder comprising:
a first input coupled to the signal output,
a second input coupled to the offset signal source, and
an output coupled to the signal input via the anti-parallel circuit of diodes, wherein the feedback path comprises a feedback amplifier coupling the signal output to the first input of the adder.

2. The sensor amplifier arrangement according to claim 1, wherein the feedback path provides a bootstrapping loop between the signal output and the signal input.

3. The sensor amplifier arrangement according to claim 1, wherein the gain of the feedback amplifier is controlled by a control signal.

4. The sensor amplifier arrangement according to claim 1, wherein the amplifier comprises an input transistor which is a field-effect transistor and comprises a control terminal connected to the signal input of the amplifier.

5. The sensor amplifier arrangement according to claim 1, wherein the offset signal source is a voltage source.

6. The sensor amplifier arrangement according to claim 1, wherein the feedback path obtains a low pass characteristic.

7. The sensor amplifier arrangement according to claim 1, wherein the sensor amplifier arrangement comprises a sensor that is a microphone coupled to the signal input of the amplifier.

8. The sensor amplifier arrangement according to claim 7, wherein the sensor amplifier arrangement comprises a biasing voltage source coupled to the sensor such that an electrode of the sensor is coupled to the signal input of the amplifier and a further electrode of the sensor is coupled to the biasing voltage source.

9. The sensor amplifier arrangement according to claim 1, wherein the feedback amplifier is an operational amplifier.

10. The sensor amplifier arrangement according to claim 1, wherein the feedback amplifier is an operational transconductance amplifier.

11. The sensor amplifier arrangement according to claim 1, wherein the feedback path comprises a filter.

12. The sensor amplifier arrangement according to claim 11, wherein the filter is coupled between the output of the feedback amplifier and the first input of the adder.

13. A method of amplifying a sensor signal comprising:
receiving a sensor signal at a signal input of an amplifier,
amplifying the sensor signal and providing an amplified sensor signal at a signal output of the amplifier, and
feeding back a feedback current by a feedback path that couples the signal output to the signal input and comprises:
an anti-parallel circuit of diodes,
an offset signal source, and
an adder comprising a first input coupled to the signal output, a second input coupled to the offset signal source, and an output coupled to the signal input via the anti-parallel circuit of diodes,
wherein the offset signal source is implemented as a voltage source and the adder is a summing circuit that sums up voltages at the first and the second inputs.

14. A sensor amplifier arrangement comprising:
an amplifier having a signal input to receive a sensor signal and a signal output to provide an amplified sensor signal, and
a feedback path that couples the signal output to the signal input, obtains a low pass characteristic and comprises
an anti-parallel circuit of diodes,
an offset signal source, and
an adder comprising:
a first input coupled to the signal output,
a second input coupled to the offset signal source, and
an output coupled to the signal input via the anti-parallel circuit of diodes.

15. A sensor amplifier arrangement comprising:
an amplifier having a signal input to receive a sensor signal and a signal output to provide an amplified sensor signal, and
a feedback path that couples the signal output to the signal input and comprises
an anti-parallel circuit of diodes,
an offset signal source which is a voltage source, and
an adder comprising:
a first input coupled to the signal output,
a second input coupled to the offset signal source, and
an output coupled to the signal input via the anti-parallel circuit of diodes,
wherein the adder is a summing circuit that sums up voltages at the first and second inputs.

16. The sensor amplifier arrangement according to claim 13, wherein the feedback path comprises a feedback amplifier coupling the signal output to the first input of the adder.

17. The sensor amplifier arrangement according to claim 13, wherein the feedback path obtains a low pass characteristic.

* * * * *